(12) United States Patent
Hoegerl et al.

(10) Patent No.: US 9,064,869 B2
(45) Date of Patent: Jun. 23, 2015

(54) SEMICONDUCTOR MODULE AND A METHOD FOR FABRICATION THEREOF BY EXTENDED EMBEDDING TECHNOLOGIES

(71) Applicant: Infineon Technologies AG, Neubiberg (DE)

(72) Inventors: Juergen Hoegerl, Regensburg (DE); Edward Fuergut, Dasing (DE); Gottfried Beer, Regensburg (DE); Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/974,583

(22) Filed: Aug. 23, 2013

(65) Prior Publication Data

US 2015/0054159 A1    Feb. 26, 2015

(51) Int. Cl.
| | |
|---|---|
| *H01L 23/18* | (2006.01) |
| *H01L 21/60* | (2006.01) |
| *H01L 23/522* | (2006.01) |
| *H01L 23/00* | (2006.01) |
| *H01L 23/28* | (2006.01) |
| *H01L 23/31* | (2006.01) |
| *H01L 23/485* | (2006.01) |
| *H01L 25/18* | (2006.01) |
| *H01L 27/12* | (2006.01) |

(52) U.S. Cl.
CPC ............ *H01L 23/5226* (2013.01); *H01L 24/89* (2013.01); *H01L 23/28* (2013.01); *H01L 23/3121* (2013.01); *H01L 23/485* (2013.01); *H01L 24/03* (2013.01); *H01L 24/09* (2013.01); *H01L 25/18* (2013.01); *H01L 27/12* (2013.01)

(58) Field of Classification Search
CPC ...................................................... H01L 23/12
See application file for complete search history.

(56) References Cited

U.S. PATENT DOCUMENTS

| | | | |
|---|---|---|---|
| 8,030,131 | B2 | 10/2011 | Otremba et al. |
| 8,648,473 | B2 | 2/2014 | Prueckl |
| 2009/0031062 | A1 | 1/2009 | Shen et al. |

(Continued)

FOREIGN PATENT DOCUMENTS

| | | |
|---|---|---|
| DE | 19924991 A1 | 12/2000 |
| DE | 10048379 A1 | 4/2001 |

(Continued)

OTHER PUBLICATIONS

Infineon Technologies AG, "Recommendations for Printed Circuit Board Assembly of Infineon Laminate Packages", Additional Information, Infineon Technologies AG, 81726, Munich, Germany, Edition 2012-032, www.infineon.com, 2013, pp. 1-16.

(Continued)

*Primary Examiner* — Stephen W Smoot
(74) *Attorney, Agent, or Firm* — Murphy, Bilak & Homiller, PLLC (57) ABSTRACT

The semiconductor module includes a carrier, a plurality of semiconductor transistor chips disposed on the carrier, a plurality of semiconductor diode chips disposed on the carrier, an encapsulation layer disposed above the semiconductor transistor chips and the semiconductor diode chips, and a metallization layer disposed above the encapsulation layer. The metallization layer includes a plurality of metallic areas forming electrical connections between selected ones of the semiconductor transistor chips and the semiconductor diode chips.

19 Claims, 8 Drawing Sheets

(56) References Cited

U.S. PATENT DOCUMENTS

| | | |
|---|---|---|
| 2009/0046437 A1 | 2/2009 | Hsieh et al. |
| 2010/0020515 A1 | 1/2010 | Rubino et al. |
| 2011/0127675 A1* | 6/2011 | Ewe et al. .................. 257/773 |
| 2013/0329374 A1 | 12/2013 | Lin et al. |

FOREIGN PATENT DOCUMENTS

| | | |
|---|---|---|
| DE | 10214953 A1 | 10/2003 |
| DE | 10244365 A1 | 4/2004 |
| DE | 102005061016 A1 | 6/2007 |
| DE | 102006056363 A1 | 6/2008 |
| DE | 102008052029 A1 | 6/2009 |
| DE | 102009032995 A1 | 3/2010 |
| DE | 102011105346 A1 | 12/2012 |
| DE | 102011113255 A1 | 3/2013 |
| EP | 2538761 A1 | 12/2012 |
| WO | 2012175207 A2 | 12/2012 |
| WO | 2013085992 A2 | 6/2013 |

OTHER PUBLICATIONS

Schweizer Electronic, "Products and Solutions", Schweizer Electronic AG, 78713 Schramberg, Germany, Oct. 2012, pp. 1-12.

Schweizer Electronic, "Schweizer Inlay Board—the Secure and Reliable Inlay Technology", Schweizer Electronic AG, Oct. 2008, 1 page.

Schweizer Systems, "p2 Pack—the Power Embedding Solution", Increasing Packing Density and Thermal Performance with Minimized Parasitics for High Power Inverters, Schweiger Electronic AG, 78713 Schramberg, Germany, publication date unknown, pp. 1-6.

* cited by examiner

SEMICONDUCTOR MODULE AND A METHOD FOR FABRICATION THEREOF BY EXTENDED EMBEDDING TECHNOLOGIES

TECHNICAL FIELD

Embodiments described herein generally relate to semiconductor modules and, more particularly, to semiconductor power chip modules such as those employed in power converter circuits, and to a method for fabricating a semiconductor module.

BACKGROUND

In many electronic systems it is necessary to employ converters like DC/DC converters, AC/DC converters, or DC/AC converters in order to generate the currents, voltages and/or frequencies to be used by an electronic circuit, like, for example, a motor driving circuit. The converter circuits as mentioned before typically comprise one or more half-bridge circuits, each provided by two semiconductor power switches, such as e.g. power MOSFET devices, and further components such as diodes connected in parallel to the transistor devices, and passive components such as an inductance and a capacitance. The switching of the power MOSFET devices can be controlled by a semiconductor control chip. The several components of the converter circuit may in principle be provided as individual components which are mounted on a printed circuit board. Alternatively, a part of or all of the components may be accommodated in a single housing to form a multi-chip module, which may have an advantage that the assembly of the entire converter circuit on the board is simplified and the space required on the board can be reduced. It remains, however, an important problem concerning the forming of the interconnections between the transistors, the diodes, and the passive components. In particular, there is a specific demand to provide semiconductor chip modules having short interconnections accompanied by low parasitic inductances, and moreover to provide a semiconductor power module having improved or satisfying heat dissipation properties.

SUMMARY

According to an embodiment of a semiconductor module, the semiconductor module comprises a carrier, a plurality of semiconductor chips disposed on the carrier, an encapsulation layer disposed above the semiconductor chips, and a metallization layer disposed above the encapsulation layer. The metallization layer comprises a plurality of metallic areas forming electrical connections between selected ones of the semiconductor chips.

According to another embodiment of a semiconductor module, the semiconductor module comprises a carrier, a plurality of semiconductor transistor chips disposed on the carrier, a plurality of semiconductor diode chips disposed on the carrier, and an encapsulation layer disposed above the semiconductor transistor chips and the semiconductor diode chips. The encapsulation layer comprises via connections to the semiconductor transistor chips and the semiconductor diode chips. The semiconductor module further comprises a metallization layer comprising a plurality of metallic areas connected with the via connections.

According to an embodiment of a method for fabricating a semiconductor module, the method comprises: proving a carrier; applying at least one semiconductor chip onto the carrier; applying an encapsulation layer above the at least one semiconductor chip and the carrier; forming via connections into the encapsulation layer, the via connections being connected with the at least one semiconductor chip and the carrier; and applying a metallization layer above the encapsulation layer, the metallization layer comprising a plurality of metallic areas connected with the via connections.

Those skilled in the art will recognize additional features and advantages upon reading the following detailed description, and upon viewing the accompanying drawings.

BRIEF DESCRIPTION OF THE DRAWING

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a semiconductor module and a method for fabricating a semiconductor module may use various types of transistor devices. The embodiments may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semiconductor chip. The embodiments may also use horizontal or vertical transistor devices wherein those structures may be provided in a form in which all contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures) like, for example, MOS transistor structures or IGBT (Insulated Gate Bipolar Transistor) structures.

In any case the semiconductor dies or semiconductor chips may comprise contact elements or contact pads on one or more of their outer surfaces wherein the contact elements serve for electrically contacting the semiconductor dies. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, gold, or copper, for example, or a metal alloy, or an electrically conducting organic material, or an electrically conducting semiconductor material. The contact elements may also be formed as layer stacks of one or more of the above-mentioned materials.

The embodiments of an electronic device or the embodiments of a transistor device may comprise an encapsulant or encapsulating material having the semiconductor dies or transistor devices embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example. Furthermore the filler increments may have the shape of fibers and can be made of carbon fibers or nanotubes, for example.

Figure 1:
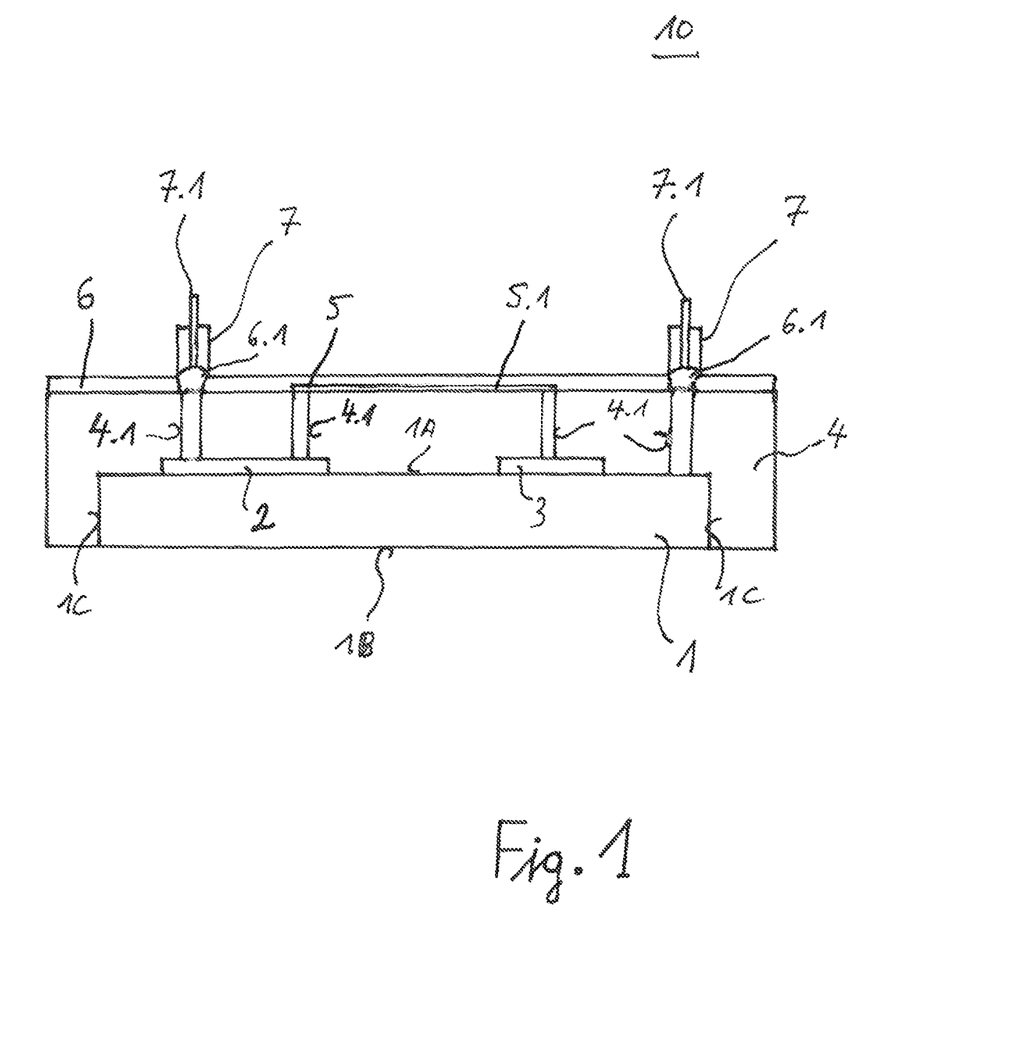
FIG. 1 shows a schematic cross-sectional side view representation of a semiconductor module comprising a transistor and a diode according to an example.

FIG. 1 shows a cross-sectional side view representation of a semiconductor module 10 according to an embodiment. The semiconductor module 10 of FIG. 1 comprises a carrier 1, a plurality of semiconductor transistor chips 2 disposed on the carrier 1 and a plurality of semiconductor diode chips 3 disposed on the carrier 1. For simplicity reasons only one semiconductor transistor chip 2 and one semiconductor diode chip 3 is shown in FIG. 1. The semiconductor module 10 further comprises an encapsulation layer 4 disposed above the semiconductor transistor chips 2 and the semiconductor diode chips 3. Above the encapsulation layer 4 a metallization layer 5 is disposed which comprises a plurality of metallic areas or lines 5.1 which form electrical connections between selected ones of the semiconductor transistor chip 2 and the semiconductor diode chip 3. In the example shown in FIG. 1 only one metallization line 5.1 of the metallization layer 5 is shown. The metallization layer 5 is a redistribution layer as it redistributes the spatial position of the contact pads of the chips 2 and 3.

According to an embodiment of the semiconductor module 10 of FIG. 1, the carrier 1 comprises a substrate which may be an inorganic or an organic substrate. The core of the substrate, in particular of the organic substrate, may comprise a thermal conductivity better than 1 W/mK. In particular, the substrate may be one or more of a direct copper bonded substrate (DCB), a direct aluminum bonded substrate (DAB), and an active metal brazing substrate (AMB), wherein the substrate may comprise a ceramic layer or tile like, for example, AlO, AlN, $Al_2O_3$, or a dielectric layer like, for example, $Si_3N_4$ direct copper bonded substrate (DCB). In particular, the DCB substrate may comprise a ceramic layer or tile with a sheet of copper bonded to both sides of the ceramic layer. 5.

According to an embodiment of the semiconductor module 10 of FIG. 1, the carrier 1 has a thickness in a range from 0.1 mm to 0.3 mm, in particular in a range from 0.15 mm to 0.25 mm.

According to an embodiment of the semiconductor module 10 of FIG. 1, the carrier 1 comprises a first upper main face 1A, a second lower main face 1B opposite to the first main face 1A, and side faces 1C connecting the first and second main faces 1A and 1B. The encapsulation layer 4 covers the first main face 1A and the side faces 1C of the carrier 1.

According to an embodiment of the semiconductor module 10 of FIG. 1, one or more of the semiconductor transistor chips 2 and the semiconductor diode chips 3 have a thickness in a range from 5 µm to 700 µm, in particular from 30 µm to 100 µm, more in particular from 50 µm to 80 µm.

According to an embodiment of the semiconductor module 10 of FIG. 1, the semiconductor transistor chips 2 each comprise one or more of a power transistor, a vertical transistor, an MOS transistor, and an insulated gate bipolar transistor (IGBT). The semiconductor device may be based on Si, GaN, SiC or any semiconductor material.

In particular, the semiconductor transistor chips 2 may each comprise a first upper main face and a second lower main face opposite to the first main face, and a source contact element disposed on the first main face, a gate contact element disposed on the first main face, and a drain contact element disposed on the second main face.

According to an embodiment of the semiconductor module 10 of FIG. 1, the semiconductor diode chips 3 each comprise SiC diodes.

According to an embodiment of the semiconductor module 10 of FIG. 1, the encapsulation layer 4 has a thickness in a range from 0.05 mm to 1.5 mm above the upper surface of the carrier 1. Moreover, the encapsulation layer 4 may have a thickness in a range from 200 mm to 300 mm above the first, upper main face of the semiconductor transistor chips 2.

According to an embodiment of the semiconductor module of FIG. 1, the encapsulation layer 4 comprises one or more of a polymer material, a mold compound material, a resin material, an epoxy resin material, an acrylate material, a polyimide material, and a silicone-based material.

According to an embodiment of the semiconductor module 10 of FIG. 1, the encapsulation layer 4 comprises via connections 4.1 connecting the metallic lines 5.1 of the metallization layer 5 with selected ones of the semiconductor transistor chips 2 and the semiconductor diode chips 3. The via connections 4.1 may have lateral diameters in a range from 0.1 mm to 1 mm, in particular from 0.3 mm to 0.7 mm. In particular, the via connections 4.1 have a ratio of height to width in a range from 0 to 3, preferably in the range of 0.3 to 3.

According to an embodiment, the via connections 4.1 comprise via holes through the encapsulation layer 4, the via holes being filled completely or in part with an electrically conducting material like, for example, a metal as, for example, copper. The electrically conducting material can be filled into the via holes in such a way that the via holes are not completely filled by the material, but instead the material only covers the walls of the via holes with a thickness less than half the diameter of the via holes.

According to an embodiment of the semiconductor module 10 of FIG. 1, the semiconductor module 10 comprises one or more half-bridge circuits wherein in each half-bridge circuit two semiconductor transistors chips are connected in series. In particular, the semiconductor module 10 may comprise six semiconductor chips wherein two respective semiconductor transistor chips are connected in series to form three half-bridge circuits.

According to an embodiment of the semiconductor module 10 of FIG. 1, each one of the semiconductor transistor chips is connected with one of the semiconductor diode chips in parallel. In particular, the semiconductor module 10 may comprise six semiconductor transistor chips and six semiconductor diode chips each of them connected in parallel to one of the semiconductor transistor chips.

According to an embodiment of the semiconductor module 10 of FIG. 1, a solder resist layer 6 is disposed above the metallization layer 5. The solder resist layer 6 may comprise openings 6.1 for providing electrical connections to specific ones of the metallic areas. On top of the solder resist layer 6 a plurality of sleeves 7 may be disposed, each one of the sleeves 7 enclosing a pin 7.1 which is connected with the respective electrical connection, wherein the plurality of pins 7.1 serve as external electrical connectors. Other solutions are possible for forming external connectors like, for example, solder bumps formed above the electrical through-connections. For illustration purposes only two sleeves 7 are shown in FIG. 1, each sleeve 7 enclosing a respective pin 7.1, wherein the right one of the two sleeves 7 may also be connected with a metallization line or area 5.1 of the metallization layer 5 which itself may be connected with a contact pad of one of the chips 2 or 3 or with that one of another chip.

According to an embodiment of the semiconductor module 10 of FIG. 1, the semiconductor transistor chips 2 and the semiconductor diode chips 3 are connected in such a way as to form an AC/AC converter circuit, an AC/DC converter circuit, a DC/AC converter circuit, a frequency converter or a DC/DC converter circuit.

In the following an example of a fabrication process is explained in connection with FIGS. 2A-J.

Figure 2:
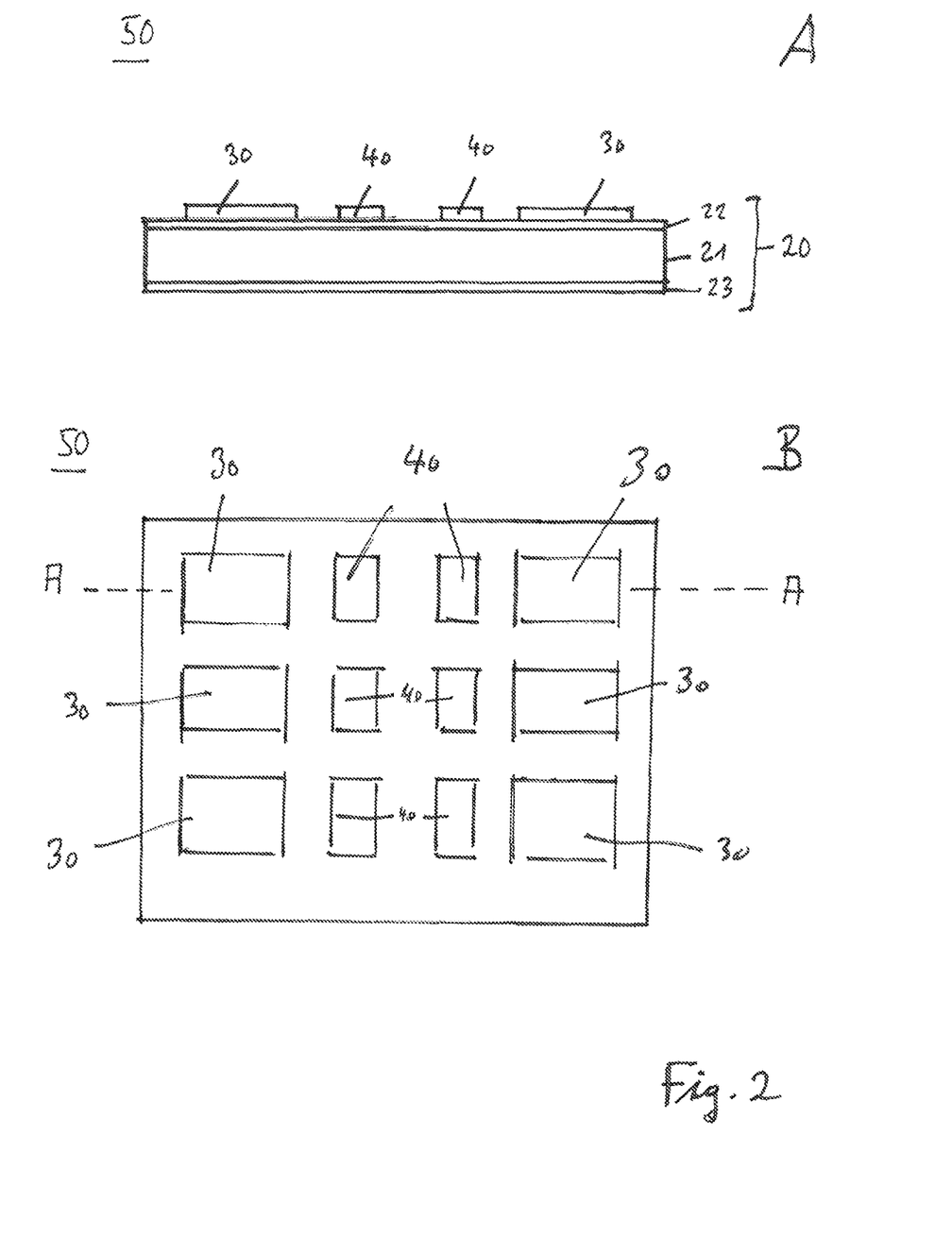
FIGS. 2A-J show schematic side view, and top view representations for illustrating a method for fabricating a plurality of semiconductor chip modules by extended embedding technology.

FIGS. 2A and B show an intermediate product of the fabrication process, the intermediate product comprising a direct bonded copper (DCB) substrate 20, semiconductor transistor chips 30 and semiconductor diode chips 40 applied onto the DCB substrate 20. The DCB substrate 20 comprises a ceramic layer 21, a first upper copper layer 22, and a second lower copper layer 23. The two copper layers 22 and 23 are applied on opposing main surfaces of the ceramic layer 21, respectively.

FIG. 2A shows a cross-sectional side view representation of the intermediate product in a plane denoted by the line A-A in FIG. 2B. The first upper copper layer 22 of the DBC substrate 20 may be structured, i.e. divided into a number of separate regions isolated from each other so that a circuit such as that shown in FIG. 3 can be built from the semiconductor chips 30 and the semiconductor diode chips 40. The semiconductor transistor chips 30 may comprise vertical transistor structures like, for example, IGBT transistors. In general, each one of the semiconductor transistor chips 30 may be constructed in a way that a first, lower main face comprises a first contact pad, in particular a drain contact pad, and a second upper main face comprises a second contact pad, in particular a source contact pad, and a third contact pad, in particular a gate contact pad. The semiconductor diode chips 40 can also comprise a vertical structure having a first contact pad on a first, lower main face and a second contact pad on a second upper main face thereof. The semiconductor transistor chips 30 and the semiconductor diode chips 40 can be applied onto respective regions of the first upper copper layer 22 by use of silver paste, solder, or sinter paste, for example. As a result, a semiconductor chip module 50 is fabricated as an intermediate product of the fabrication process.

In the following, it will be shown how a plurality of semiconductor chip modules 50 such as those shown in FIGS. 2A and B can be further processed in parallel. According to FIGS. 2C and D, a carrier 60 is provided which can be made of any kind of material and may comprise any desired form or shape. Besides a rectangular format as shown in FIG. 2D, also other formats like a square or a circular format are possible. Then a plurality of semiconductor chip modules 50 are fabricated as previously described with regard to FIGS. 2A and B, and the semiconductor chip modules 50 are attached to the carrier 60 at a distance from each other. For reasons of simplicity only two semiconductor chip modules 50 are shown. The semiconductor chip modules 50 can be arranged, for example, on the carrier 60 in the form of a matrix arrangement as shown in FIG. 2D. The semiconductor chip modules 50 can, for example, be adhered to the carrier 60 by use of an adhesion layer, adhesion film, adhesion foil or adhesion band, in particular a double-sided adhesion film or adhesion foil. On the one hand, there is a desire to arrange as many as possible semiconductor chip modules 50 onto the carrier 60 in order to maximize the through-put of the fabrication process. On the other hand, however, the semiconductor chip modules 50 have to be placed onto the carrier 60 having a pre-defined distance from each other which defines the outline of the semiconductor chip packages to be fabricated. Therefore, an adequate trade-off has to be found between a high through-put and dimension requirements of the semiconductor chip packages to be fabricated. The carrier 60 can, for example, have a square format of the dimension 300×300 mm. The carrier 60 can also have a rectangular format. The side length of the side edges of the carrier 60 can, for example, be in a range from 100 mm to 700 mm like a substrate of printed circuits boards.

FIGS. 2E and F show the fabrication of a semiconductor device panel, also called an "artificial wafer" herein. The fabrication process is similar to embedded wafer level packaging. At first, an encapsulation layer 70 is applied over an upper surface of the carrier 60 and the semiconductor chip modules 50 applied thereon. The encapsulation layer 70 can, for example, be applied by compression molding and it can be made of any material as described above. In particular, it is desirable that the encapsulation layer 70 should be heat-resistant up to 300° C. and, moreover, the encapsulation layer 70 should have high insulation resistance or insulation strength. The thickness of the encapsulation layer 70 can be adjusted in such a way that a layer portion reaching from an upper surface of the semiconductor chip modules 50 to an upper surface of the encapsulation layer 70 lies in a range from 100 μm to 600 μm, in particular from 200 μm to 300 μm. Besides that, the encapsulation layer 70 may be applied in such a way that it covers the top main faces and all four side faces of all semiconductor chip modules 50. Besides that, the encapsulation layer 70 may be applied in such a way that the format and the shape of the encapsulation layer 70 corresponds to the format and the shape of the carrier 60, i.e. the encapsulation layer 70 and the carrier 60 are congruent with each other and their outer boundaries lie above each other.

After applying the encapsulation layer 70, a step of curing or hardening of the encapsulation layer 70 is performed by use of appropriate measures. Afterwards, the carrier 60 is de-bonded from the encapsulation layer 70 and the carrier 60 can then be re-used for a further fabrication process. As a result, which is shown in FIG. 2F, a semiconductor device panel 80 is obtained which consists of a rigid encapsulation layer 70 and a plurality of semiconductor chip modules 50 embedded therein. The fabrication process thus resembles an embedding wafer level process for processing of single semiconductor chips and fabricating semiconductor packages thereof. An additional adhesion layer (not depicted) can be applied.

Vias 71 can, for example, be formed by drilling with the use of an appropriate laser beam. Alternatively the vias 71 can be fabricated by attaching solid pins to the contact pads of the semiconductor transistor chips 30 and the semiconductor diode chips 40 before applying the encapsulation layer 70 and then removing the pins after applying the encapsulation layer 70. The length of the pins has to be greater than the thickness of the encapsulation layer 70, in particular the portion of the encapsulation layer 70 reaching from an upper main face of the semiconductor chip modules 50 to an upper main face of the encapsulation layer 70. The vias 71 can have a circular cross-section. The width or diameter of the vias 71 can be greater than 100 μm. In particular, the diameter of the vias 71 can be greater than the depth of the vias 71. In particular, a ratio between the length and the diameter of the vias 71 can be in a range between 0.2 and 5.

The vias 71 are then filled with an electrical conductive material like, for example, copper. The filling procedure can be performed in such a way that the vias 71 are not completely filled with the conductive material but instead the conductive material only covers the inner wall of each one of the vias 71 with a thickness less than half of the diameter of the via 71. The filling procedure can be performed in such away that at first a seed layer is applied by, for example, PVD (physical vapor deposition), e-less or any coating onto the upper main face of the encapsulation layer 70 so that the seed layer covers the entire upper main face and the inner walls of the vias 71 of the encapsulation layer 70. Thereafter galvanical plating or electro-less plating can be employed for growing a copper layer, metal alloys or metal stacks onto the seed layer. Then the plated copper layer has to be structured so that only copper areas or traces are left back which form necessary electrical connections between semiconductor transistor chips 30 and semiconductor diode chips 40 within each one of the semiconductor chip modules 50. Alternative to subtractive structuring of the traces 72 a semi-additive process might be applied analog to high density substrate processing. The copper traces are indicated in FIG. 2G with reference sign 72.

In addition, simultaneous with the process of plating the copper layer onto the upper main face of the encapsulation layer 70, also a copper layer can be plated onto the back surface of the panel 80. Afterwards, this backside plated copper layer can then be structured so that only quadratic or rectangular copper areas remain which is not shown in FIG. 2G for reasons of simplicity. The remaining copper areas can be smaller than the package size of each one of the semiconductor chip modules 50. As a result an intermediate product, as shown in FIG. 2G, is obtained.

A solder resist layer 90 is then applied onto the upper main face of the encapsulation layer 70 and the metallization areas 72, and thereafter openings 91 are formed in the solder resist layer 90 in predetermined portions of the metallization areas 72. The solder resist layer 90 can, for example, be made of any dielectric or polymer material. As a result an intermediate product, as shown in FIG. 2H, is shown.

In the next step the openings 91 in the solder resist layer 90 are filled with an electrically conductive material like, for example, a solder material, hollow sleeves 95 are attached onto the openings 91, and metallic pins 96 are put into the hollow space of the sleeves 95 and connected with the solder material. The pins 96 are enclosed by the sleeves 95 so that the sleeves 95 provide their respective pins with astable support and foot-hold. The pins 95 may serve as external pins extending to the outside of housing walls of the finalized electronic device and the empty space between the solder resist layer 90 and the housing walls may be filled up with silicone, for example. As a result an intermediate product, as shown in FIG. 2I, is shown.

The panel is then separated into individual electronic devices 100 as shown in FIG. 2J.

Figure 3:
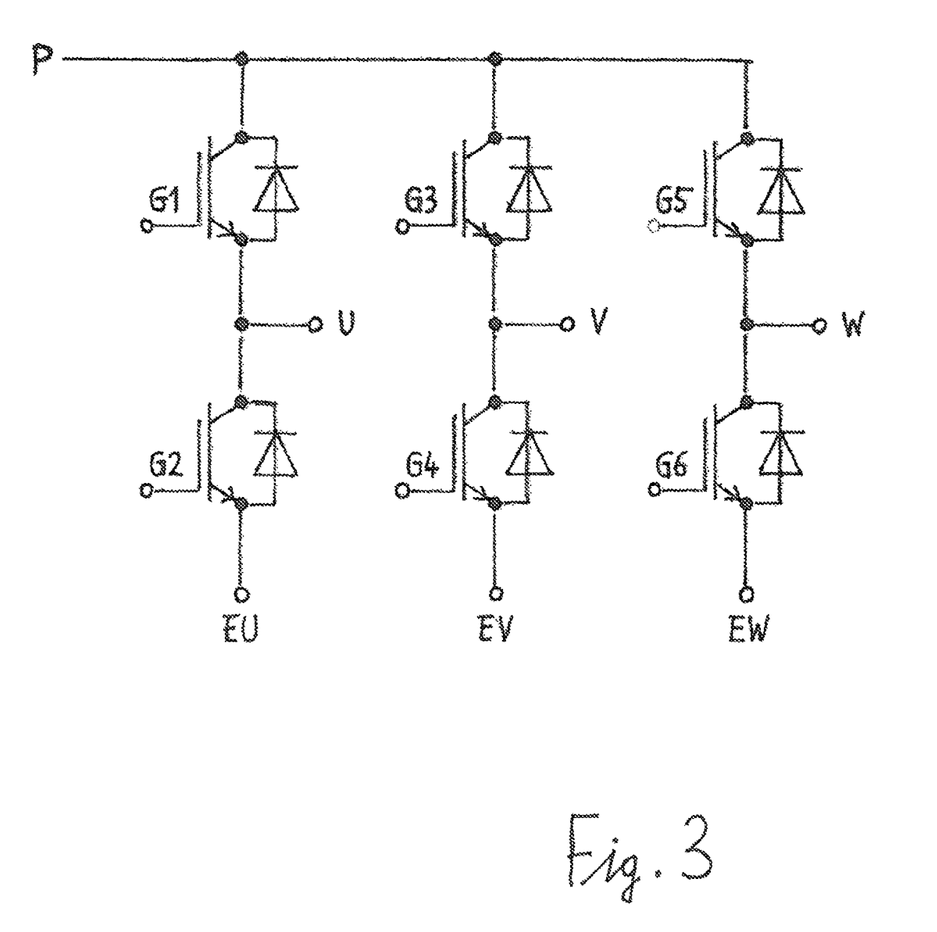
FIG. 3 shows a schematic circuit representation of a three-phase semiconductor converter circuit comprising six transistors and six diodes.

FIG. 3 shows an example of a circuit which can be realized by the semiconductor chip module described above. The circuit design shown in FIG. 3 represents a three-phase inverter circuit for generating three-phase alternating current which can be used, for example, for driving an electric motor. The circuit comprises six transistors G1-G6 each one of which is connected in parallel to one of six diodes D1-D6. The circuit is divided in three half-bridge circuits, each one of the half-bridge circuits providing one phase of the three-phase currents. In particular, a first half-bridge circuit is formed by a series connection of the transistors G1 and G2 providing a first current U at a node between the transistors G1 and G2, a second half-bridge circuit is formed by a series connection of the transistors G3 and G4 providing a second current V at a node between the transistors G3 and G4, and a third half-bridge circuit is formed by a series connection of the transistors G5 and G6 providing a third current W at a node between the transistors G5 and G6. Each one of the three half-bridge circuits is provided with one of three voltages EU, EV and EW and each one of these voltages is input at a source terminal of one of the transistor of the respective half-bridge circuit. The drain contacts of the respective other transistors of the half-bridge circuits are connected to one common potential P.

For fabricating an electronic circuit as shown in FIG. 3 in the form of a semiconductor chip module comprising semiconductor transistor chips and semiconductor diode chips, two different concepts are described next. The first concept may be denoted as "common DCB approach" and the second concept may be denoted as "segmented DCB approach". In the common DCB approach at the beginning one DCB substrate is provided and all six semiconductor transistor chips and all semiconductor diode chips are attached on the one DCB substrate as indicated in FIG. 2A, B. In the segmented DCB approach, however, six small DCB substrates are provided to form six identical basic cells thereof, wherein each one of the basic cells is fabricated by attaching a semiconductor transistor chip and a semiconductor diode chip onto one of the small DCB substrates.

Figure 4:
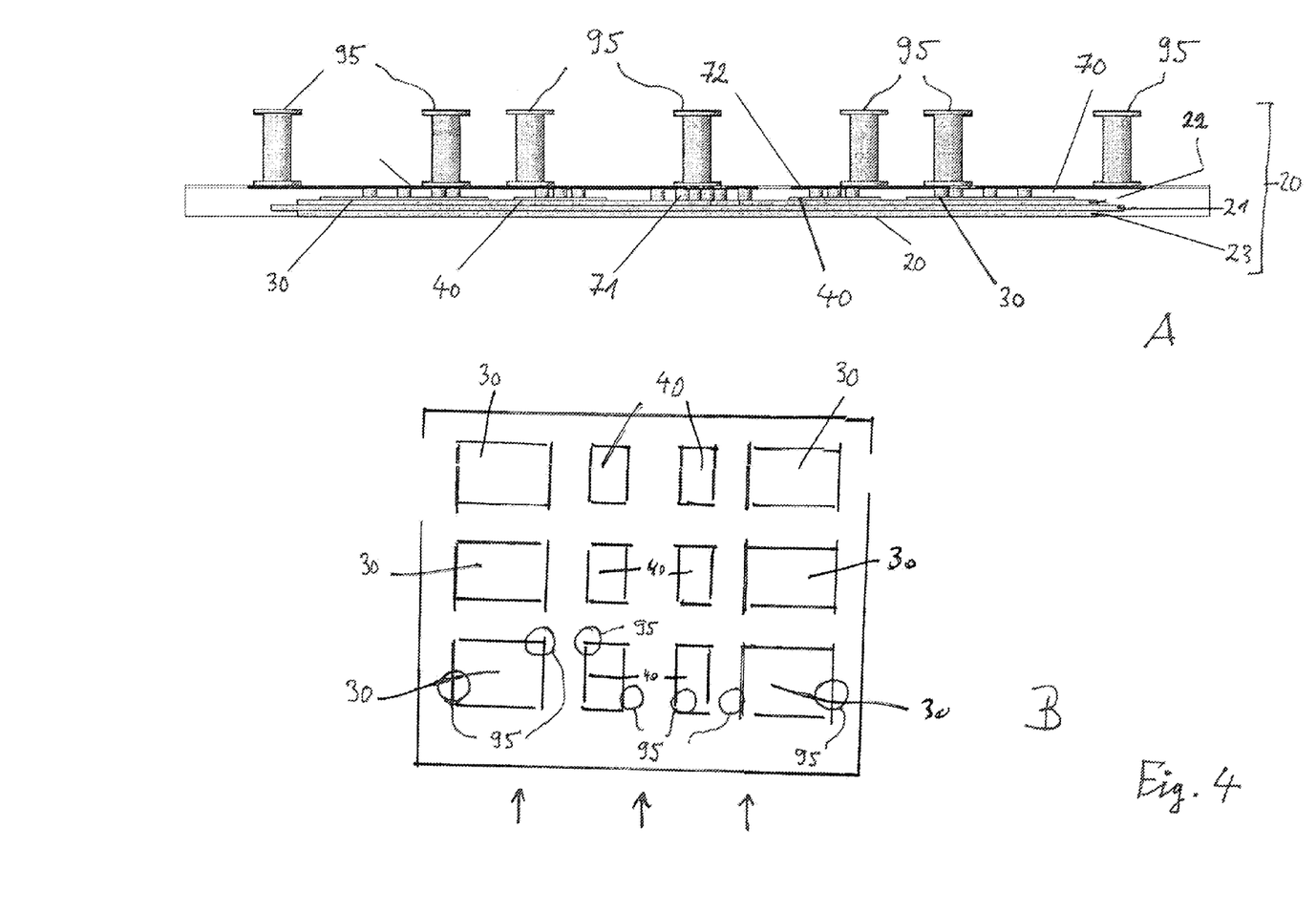
FIGS. 4A-B show an example of a semiconductor chip module comprising six transistors and six diodes in a side view representation (A) and in a top view representation (B).

FIG. 4A shows a side view representation of a semiconductor chip module according to the common DCB approach, and FIG. 4B shows a top view representation thereof only for illustrating the relative positions of the transistor chips 30, the diode chips 40, and the sleeves 95. The side view representation of FIG. 4A shows one of the three half-bridge circuits comprising two IGBT transistor chips 30 and two diode chips 40. The side view representation of FIG. 4A is taken as indicated by the arrows in FIG. 4B and shows seven sleeves 95. In the top view representation of FIG. 4B, it can be seen that these seven sleeves 95 are arranged laterally very near to the respective semiconductor transistor chips 30 or semiconductor diode chips 40. It becomes apparent therefrom that the lengths of the electrical connection lines and thus also parasitic inductances can be significantly reduced.

Figure 5:
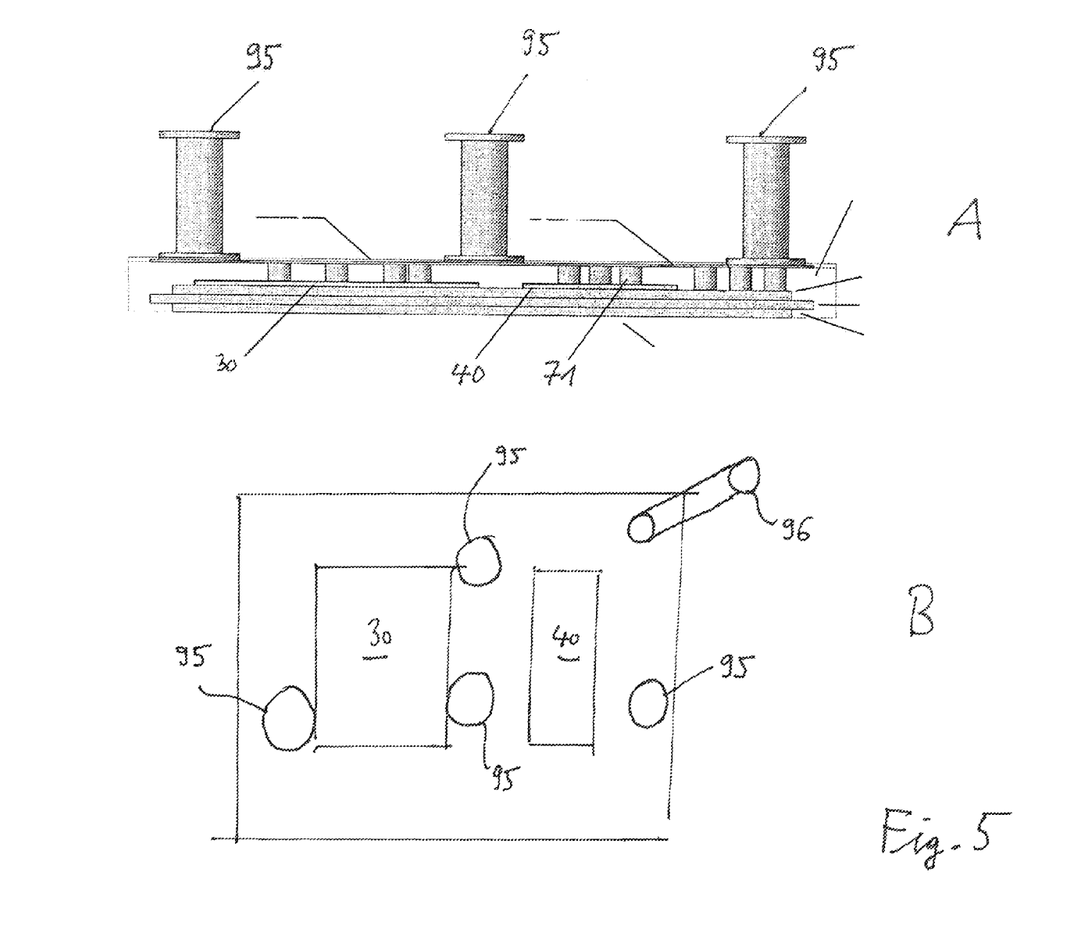
FIGS. 5A-B show an example of a semiconductor chip module functioning as a basic cell and comprising one transistor and one diode in a side view representation (A) and in a top view representation (B).

FIG. 5A shows a side view representation of a semiconductor chip module according to the segmented DCB approach, and FIG. 5B shows a top view representation thereof. For reasons of simplicity the same reference signs for the same functional elements as in FIGS. 4A and B are used in FIGS. 5A and 5B. It can be seen in the side view representation of FIG. 5A that the semiconductor chip module comprises one IGBT transistor chip 30 and one diode chip 40. The side view representation of FIG. 5A also shows three sleeves 95 which are also arranged very near to the semiconductor transistor chip 30 or the semiconductor diode chip 40. The top view representation of FIG. 5B shows that the semiconductor chip module comprises one further sleeve 95 and one so-called jumper sleeve 96 which serves for making an electrical connection to another one of the segmented DCB substrates. Six "known good" tested segmented DCB substrates can be arranged to an 'Six Pack' by mounting onto the carrier or cooling element to form an electrical circuit as shown in FIG. 3.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A semiconductor module, comprising:
    a contiguous carrier comprising an upper surface, a lower surface and side faces connecting the upper surface to the lower surface;
    a plurality of semiconductor chips disposed on the contiguous carrier;
    an encapsulation layer disposed above the semiconductor chips, the encapsulation layer covering the upper surface and the side faces of the contiguous carrier; and
    a metallization layer disposed above the encapsulation layer, the metallization layer comprising a plurality of metallic areas forming electrical connections between selected ones of the semiconductor chips.

2. The semiconductor module according to claim 1, comprising at least one semiconductor transistor chip and at least one semiconductor diode chip disposed on the contiguous carrier.

3. The semiconductor module according to claim 2, wherein the encapsulation layer comprises via connections connecting the metallic areas with selected ones of the at least one semiconductor transistor chip and the at least one semiconductor diode chip.

4. The semiconductor module according to claim 2, wherein each one of the at least one semiconductor transistor chip is connected with one of the at least one semiconductor diode chip in parallel.

5. The semiconductor according to claim 1, wherein the contiguous carrier comprises an inorganic substrate.

6. The semiconductor module according to claim 1, wherein
    the contiguous carrier comprises one or more of a direct copper bonded substrate, a direct aluminum bonded substrate, and an active metal brazing substrate, and wherein the substrate comprises a ceramic layer or a dielectric layer.

7. The semiconductor module according to claim 1, wherein the contiguous carrier comprises an organic composite substrate.

8. The semiconductor module according claim 7, wherein a core of the organic substrate has a thermal conductivity greater than 1 W/mK.

9. The semiconductor module according to claim 1, wherein the contiguous carrier has a thickness in a range from 0.1 mm to 0.7 mm.

10. The semiconductor module according to claim 9, wherein the encapsulation layer comprises vias having lateral diameters greater than 50 μm.

11. The semiconductor module according to claim 1, wherein the encapsulation layer has a thickness in a range from 0.05 mm to 1 mm.

12. The semiconductor module according to claim 1, wherein the encapsulation layer comprises one or more of a polymer material, a mold material, a resin material, an epoxy resin material, an acrylate material, polyimide material, and a silicone-based material.

13. The semiconductor module according to claim 1, wherein the contiguous carrier comprises a first upper main face, a second lower main face opposite to the first main face, and side faces connecting the first and second main faces, wherein the plurality of semiconductor chips is disposed on the first main face and the encapsulation layer covers the first main face and the side faces of the contiguous carrier.

14. A semiconductor module, comprising:
    a carrier;
    a plurality of semiconductor transistor chips disposed on the carrier;

a plurality of semiconductor diode chips disposed on the carrier;

an encapsulation layer disposed above the semiconductor transistor chips and the semiconductor diode chips, the encapsulation layer comprising via connections to the semiconductor transistor chips and the semiconductor diode chips;

a metallization layer comprising a plurality of metallic areas connected with the via connections; and a plurality of pins connected with the metallization layer and configured to serves as external electrical connectors.

15. The semiconductor module according to claim 14, wherein the carrier comprises a ceramic layer.

16. The semiconductor module according to claim 14, wherein the semiconductor transistor chips and the semiconductor diode chips are connected to form an AC/AC converter circuit, an AC/DC converter circuit, a DC/AC converter circuit, a frequency converter or a DC/DC converter circuit.

17. A method for fabricating a semiconductor module, the method comprising:

providing a plurality of carriers;

applying a plurality of semiconductor chips onto each carrier of the plurality of carriers;

applying an encapsulation layer above the plurality of semiconductor chips and the plurality of carriers;

forming via connections into the encapsulation layer, the via connections being connected with the plurality of semiconductor chips and the plurality of carriers; and applying a metallization layer above the encapsulation layer, the metallization layer comprising a plurality of metallic areas connected with the via connections.

18. The method according to claim 17, wherein the encapsulation layer is applied on an upper main face and side faces of the carrier.

19. The method according to claim 17, wherein forming the via connections comprises forming via holes by laser drilling and filling a metallic material into the via holes.

* * * * *

UNITED STATES PATENT AND TRADEMARK OFFICE
CERTIFICATE OF CORRECTION

PATENT NO. : 9,064,869 B2  
APPLICATION NO. : 13/974583  
DATED : June 23, 2015  
INVENTOR(S) : J. Hoegerl et al.

Page 1 of 1

It is certified that error appears in the above-identified patent and that said Letters Patent is hereby corrected as shown below:

On The Title Page, Item (56)/Other Publications, page 2, column 2, line 8, please change "Schweiger Electronic" to -- Schweizer Electronic --

In The Claims

Column 11, line 11 (claim 14, line 15) please change "configured to serves" to -- configured to serve --

Signed and Sealed this  
Ninth Day of February, 2016

Michelle K. Lee  
*Director of the United States Patent and Trademark Office*